United States Patent
Fish et al.

(10) Patent No.: US 7,977,652 B2
(45) Date of Patent: Jul. 12, 2011

(54) OPTICAL HEATER FOR CRYOGENIC ION IMPLANTER SURFACE REGENERATION

(75) Inventors: Roger B. Fish, Bedford, MA (US); Jeffrey E. Krampert, Topsfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 60 days.

(21) Appl. No.: 12/569,128

(22) Filed: Sep. 29, 2009

(65) Prior Publication Data

US 2011/0073780 A1    Mar. 31, 2011

(51) Int. Cl.
*H01J 37/08* (2006.01)
(52) U.S. Cl. ..................... 250/492.21; 134/1
(58) Field of Classification Search ............ 250/492.21, 250/443.1; 134/1
See application file for complete search history.

(56) References Cited

U.S. PATENT DOCUMENTS

| | | | |
|---|---|---|---|
| 5,625,526 A | 4/1997 | Watanabe et al. | |
| 5,971,701 A | 10/1999 | Kawamura | |
| 2007/0114208 A1 | 5/2007 | Takahashi | |
| 2008/0044257 A1 | 2/2008 | England et al. | |
| 2009/0303306 A1* | 12/2009 | Fish et al. | 347/171 |

* cited by examiner

*Primary Examiner* — Kiet T Nguyen

(57) ABSTRACT

In an ion implanter, one or more optical heaters are disposed above a pair of support arms. The support arms have an engaged positioned which is disposed beneath a platen and a retractable position displaced vertically away from the platen and rotated away from the platen in a direction parallel to a planar surface thereof. When the support arms are in the retracted position, the one or more optical heaters is configured to provide optical energy incident on surfaces of the cooling pads disposed on the support arms for removal of unwanted materials thereon. In this manner, the optical heaters are used during a regeneration cycle of cryogenic surfaces in an ion implanter.

11 Claims, 4 Drawing Sheets

OPTICAL HEATER FOR CRYOGENIC ION IMPLANTER SURFACE REGENERATION

BACKGROUND OF THE INVENTION

1. Field of the Invention

Embodiments of the invention relate to the field of semiconductor device fabrication. More particularly, the present invention relates to an apparatus for regeneration of cryogenic ion implanter surfaces utilizing an optical heater.

2. Discussion of Related Art

Ion implantation is a process used to dope impurity ions into a semiconductor substrate to obtain desired device characteristics. An ion beam is directed from an ion source chamber toward a substrate. The depth of implantation into the substrate is based on the ion implant energy and the mass of the ions generated in the source chamber. One or more ion species may be implanted at different energy and dose levels to obtain desired device structures. In addition, the beam dose (the amount of ions implanted in the substrate) and the beam current (the uniformity of the ion beam) can be manipulated to provide a desired doping profile in the substrate. However, throughput or manufacturing of semiconductor devices is highly dependent on the uniformity of the ion beam on the target substrate to produce the desired semiconductor device characteristics.

FIG. 1 is a block diagram of an ion implanter 100 including an ion source chamber 102. A power supply 101 supplies the required energy to source 102 which is configured to generate ions of a particular species. The generated ions are extracted from the source through a series of electrodes 104 and formed into a beam 95 which passes through a mass analyzer magnet 106. The mass analyzer is configured with a particular magnetic field such that only the ions with a desired mass-to-charge ratio are able to travel through the analyzer for maximum transmission through the mass resolving slit 107. Ions of the desired species pass from mass slit 107 through deceleration stage 108 to corrector magnet 110. Corrector magnet 110 is energized to deflect ion beamlets in accordance with the strength and direction of the applied magnetic field to provide a ribbon beam targeted toward a work piece or substrate positioned on support (e.g. platen) 114. In some embodiments, a second deceleration stage 112 may be disposed between corrector magnet 110 and support 114. The ions lose energy when they collide with electrons and nuclei in the substrate and come to rest at a desired depth within the substrate based on the acceleration energy.

The ion source chamber 102 typically includes a heated filament which ionizes a feed gas introduced into the chamber to form charged ions and electrons (plasma). The heating element may be, for example, a Bernas source filament, an indirectly heated cathode (IHC) assembly or other thermal electron source. Different feed gases are supplied to the ion source chamber to obtain ion beams having particular dopant characteristics. For example, the introduction of $H_2$, $BF_3$ and $AsH_3$ at relatively high chamber temperatures are broken down into mono-atoms having high implant energies. High implant energies are usually associated with values greater than 20 keV. For low-energy ion implantation, heavier charged molecules such as decaborane, carborane, etc., are introduced into the source chamber at a lower chamber temperature which preserves the molecular structure of the ionized molecules having lower implant energies. Low implant energies typically have values below 20 keV.

It has been discovered that a relatively low substrate or wafer temperature during ion implantation improves implant performance. In particular, lower wafer temperatures reduces the amount of damage caused when ions hit the substrate (damage layer). This decreased damage layer improves device leakage currents. This allows manufacturers to create abrupt source-drain extensions and ultra-shallow junctions needed for today's semiconductor devices. When the temperature of the wafer is decreased, the thickness of the amorphous silicon layer increases because of a reduction in the self-annealing effect. Typically, cooling reduces the temperature of the platen upon which the wafer is disposed in the range of between room temperature to about −100° C. Almost all existing low-temperature ion implanters cool wafers directly during ion implantation. However, lowering of the temperature of the wafer surface in an ion implanter tends to condense water molecules and other volatile compounds such as photoresist byproducts. Extended exposure of the vacuum chamber to low-temperature wafers may result in icing from the condensed water molecules. These unwanted conditions compromise implantation profiles as well as require incorporation of components configured to dispose of unwanted cryogenic byproducts.

A regeneration cycle is used to clean these cryogenic component surfaces which includes heating the surface of the affected components using electrical heaters and/or warm gas distributed over and/or through the component. However, these processes require the electrical heaters and gas flow devices to heat the component to a sufficient level which takes additional valuable system down time. Consequently, regeneration process cycles require long periods of equipment downtime which negatively impacts manufacturing throughput.

SUMMARY OF THE INVENTION

Exemplary embodiments of the present invention are directed to an apparatus for regeneration of cryogenic surfaces in ion implanters. In an exemplary embodiment, such an apparatus includes a platen, a pair of support arms and an optical heater. The pair of support arms have an engaged positioned disposed beneath the platen and a retractable position displaced away from the platen in a direction parallel to a planar surface of the platen. An optical heater is disposed above the pair of support arms when the support arms are in the retractable position. The optical heater is configured to supply optical energy incident on at least one of coolant pads disposed on each of the support arms.

DESCRIPTION OF EMBODIMENTS

Figure 1:
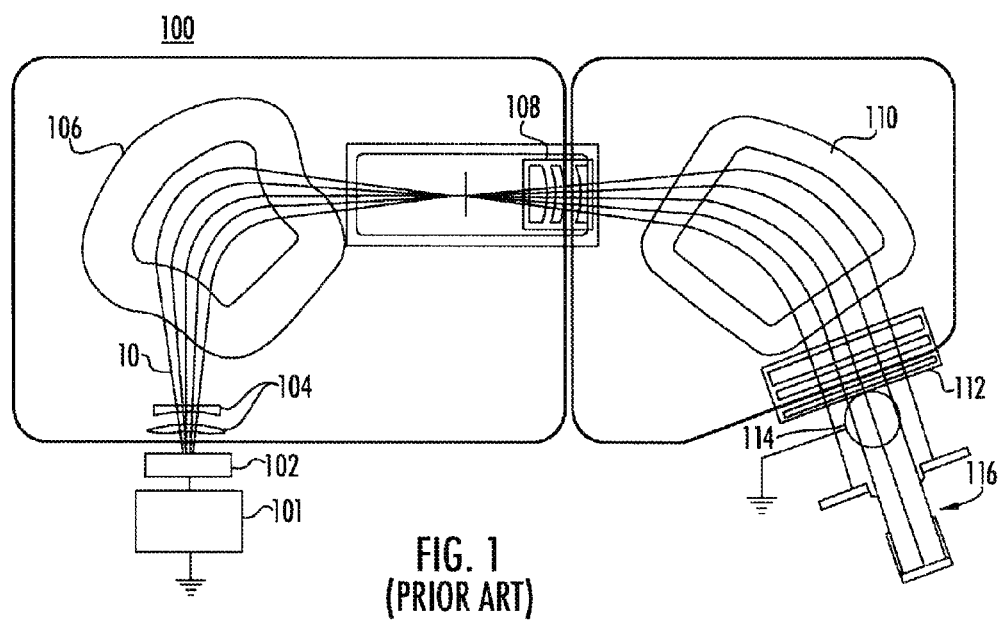
FIG. 1 illustrates a block diagram of a representative ion implanter.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2:
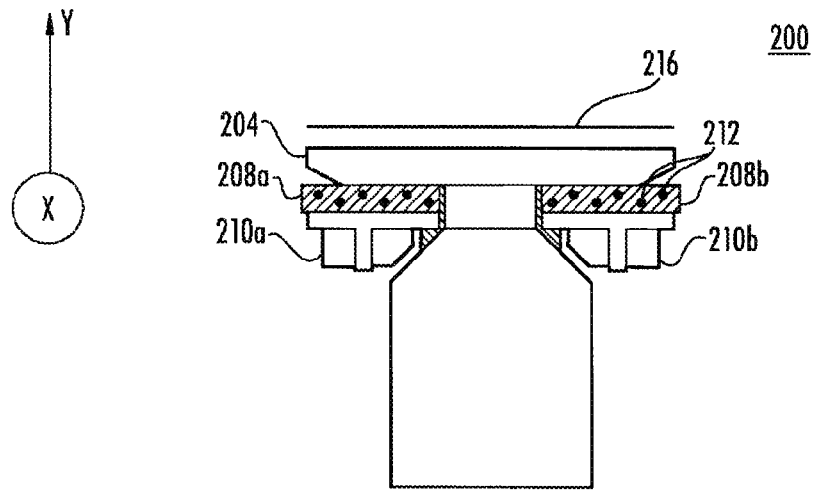
FIG. 2 is a side view of a platen and a pair of support arms in an engaged position in accordance with an embodiment of the present invention.

FIG. 2 is a side view of an apparatus 200 including a pair of support arms 210a and 210b in an engaged position with a platen 204. Platen 204 is used to support a wafer or substrate 216. A pair of thermal pads 208a and 208b are disposed on respective support arms 210a and 210b. In an engaged position during implantation, arms 210a and 210b and consequently pads 208a and 208b, are disposed beneath platen 204. The pads 208a and 208b include a plurality, of channels 212 to accommodate the flow of coolant, therethrough. The coolant flowing through the channels 212 cools the pads 208a and 208b which in turn cools the platen 204 by contact with a gas heat transfer fluid in the contact area. The wafer 216 is cooled to a desired temperature for ion implantation by platen 204 due to contact therewith and the gas heat transfer fluid in the contact area between the wafer 216 and platen 204. The coolant may be, for example, N2 gas at −180 C. Alternatively, pads 208a and 208b may be integrally formed with respective support arms 210a and 210b and configured with the plurality of channels 212 to accommodate coolant flow. The channels 212 connect to one or more pipes 214 (shown in FIG. 3) that provide the coolant and the heat transfer gas to the pads from a supply source (not shown). An actuating arm 205 is configured to displace the thermal pads 208a and 208b and support arms 210a and 210b vertically in direction Y toward and away from platen 204. In addition, support arms 210a and 210b are rotatably displaced in direction X away from platen 204 as illustrated in FIG. 5 below.

Figure 3:
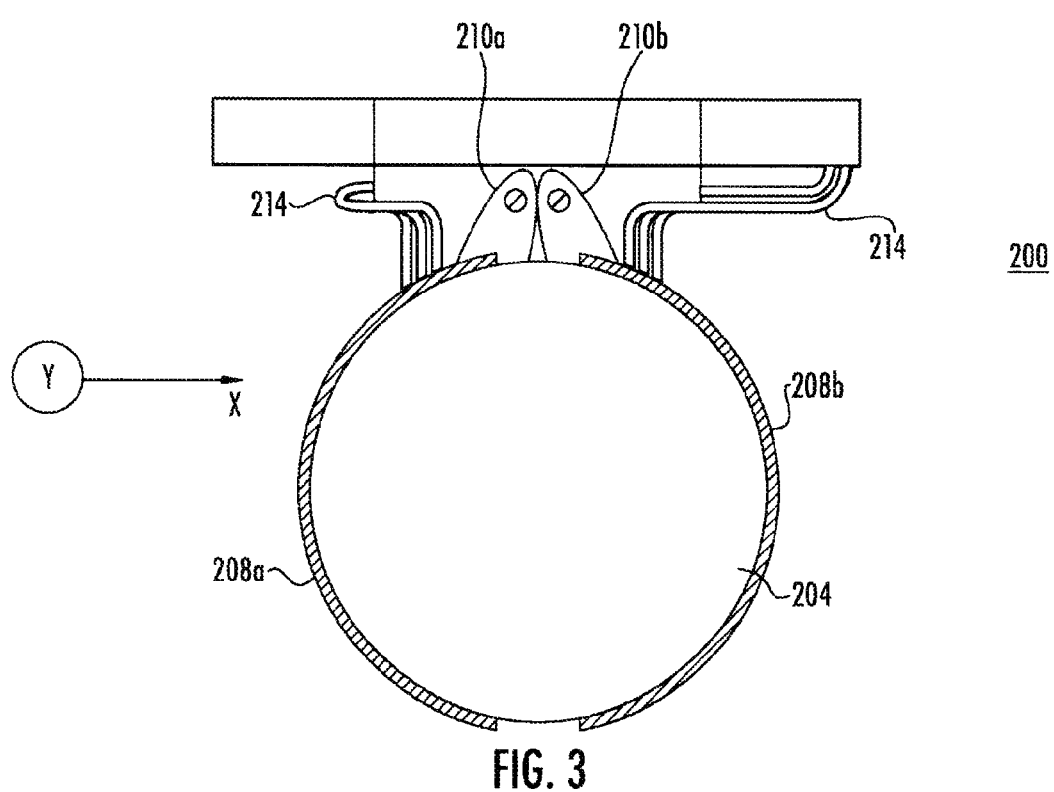
FIG. 3 is a top view of the platen shown in FIG. 2 with the support arms in the engaged position in accordance with an embodiment of the present invention.

FIG. 3 is a top view of support arms 210a and 210b in the engaged position where pads 208a and 208b are disposed underneath platen 204. Mounting frame 218 may be used for rotatably mounting support arms 210a and 210b. Pipes 214 supply coolant to pads 208a and 208b. As described above, the flow of coolant may condense unwanted moisture which, over time in a vacuum, may result in icing conditions on the components. These icing conditions negatively impact the cooling performance of the support arms 210a and 210b and/or pads 208a and 208b which in turn negatively impacts the cooling of the platen and associated wafer. These conditions necessitate a regeneration process where the unwanted moisture and any photoresist byproducts are removed from the surfaces of the components, namely support arms 210a and 210b.

Figure 4:
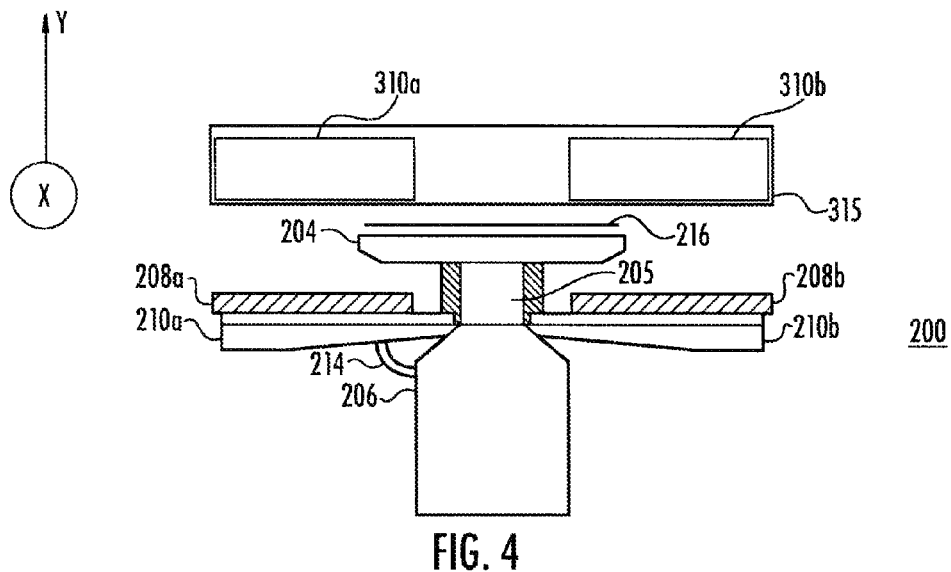
FIG. 4 is a side view of an exemplary simplified portion of an ion implanter with the support arms in the retracted position illustrating the optical heaters in accordance with an embodiment of the present invention.

FIG. 4, is a side view of the apparatus 200 when the support arms 210a and 210b are displaced vertically down from platen 204 in direction Y by actuating arm 205 or by raising the platen 204 support in direction X along a plane parallel to and below a lower surface of the platen. In this position, the support arms 210a and 210b are rotated away from platen 204 and disposed underneath a pair of optical heaters 310a and 310b which are positioned above respective support arms 210a and 210b. Alternatively, optical heaters may be a single heater which extends over both support arms 210a and 210b. In addition, optical heaters 310a and 310b may be disposed within a support frame 315 which is positioned vertically above the support arms in direction Y. Typically, support arms 210a and 210b are made from aluminum and as a result have low emissivity. Typical machined aluminum emissivity ranges from about 0.03 to about 0.09. The heaters 310a and 310b emit optical energy which projects onto the surface of each of the support arms and the pads 208a and 208b the surface of which are warmed by the absorption of photons. By using optical heaters positioned above support arms 210a and 210b, only the condensed materials on the support arms and a thin layer of its surface material are heated. The condensed material removed from the surface of each of the support arms 210a and 210b and/or pads 208a and 208b is then pumped away into the vacuum system and disposed.

Figure 5:
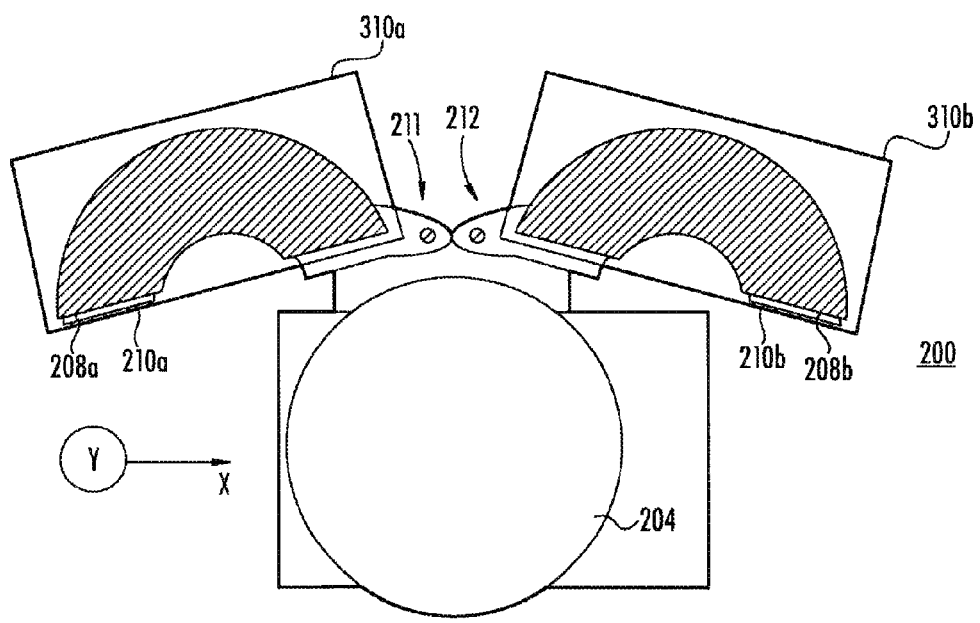
FIG. 5 is a top view of the heaters and the platen shown in FIG. 4 in accordance with an embodiment of the present invention.

FIG. 5 is a top view of the support arms 210a and 210b in a retracted position displaced vertically downward in direction Y away from platen 204. As can be seen, each of the support arms 210a and 210b are also rotated out and away from platen 204 in direction X to be disposed beneath optical heaters 310a and 310b respectively. Support arm 210a pivots about a first end 211 and support arm 210 pivots about a first end 212. Each of the support arms 210a and 210b have a semi-circle configuration to fit beneath platen 204. Optical heaters 310a and 310b are illustrated having a generally rectangular shape, however each heater may have alternative shapes to efficiently provide emission of optical energy incident on the surface of respective support arms 210a and 210b. The surface of each of the support arms are warmed by the optical energy emitted by the optical heaters. By using optical heaters, the condensed material on the surfaces of the support arms 210a and 210b is disposed of after only brief exposure. In this manner, regeneration of the support arms is accomplished quickly, thereby reducing equipment down time and increasing manufacturing throughput.

Figure 6:
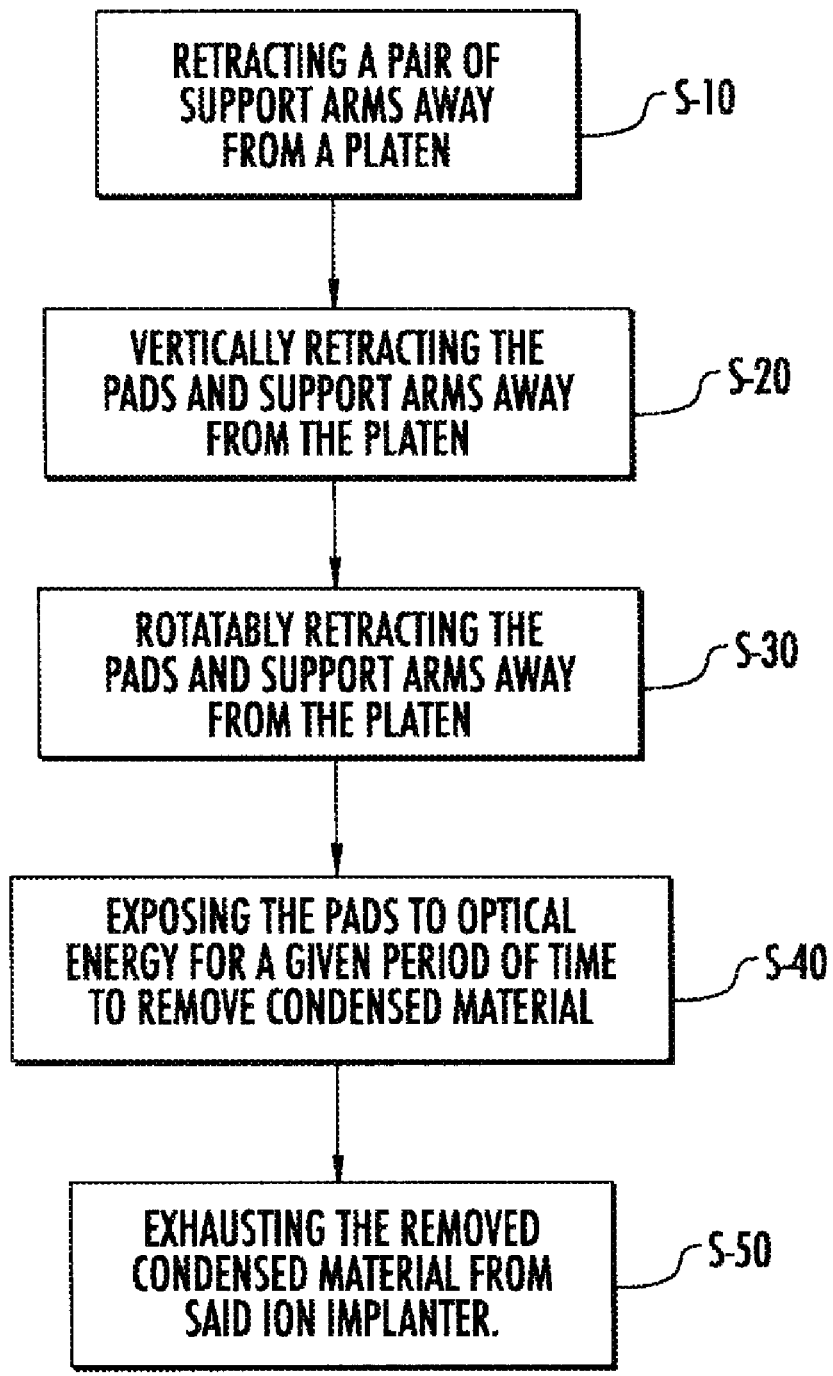
FIG. 6 is a flow chart of an exemplary regeneration process in accordance with an embodiment of the present invention.

FIG. 6 is a flow chart of an exemplary method of regenerating cryogenic surfaces within an ion implanter. At step S-10, the pair of support arms 210a and 210b on which pads 208a and 208b are disposed are retracted away from platen 204. The support arms and pad are retracted by moving the assembly vertically downward away from the platen at step S-20 and rotating the support arms out and away from the platen at step S-30. At step S-40, the pads 208a and 208b are exposed to optical energy for a given period of time such that any condensed material disposed on one or more of the pads is removed. The removed material is then exhausted from the ion implanter at step S-50.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. An apparatus for use in an ion implanter comprising:
   a platen;
   a pair of support arms having an engaged positioned disposed beneath said platen and a retractable position displaced away from said platen in a direction parallel to a planar surface of said platen; and
   an optical heater disposed above said pair of support arms when said support arms are in said retractable position, said optical heater configured to supply optical energy incident on at least one of said support arms.

2. The apparatus of claim 1 wherein said optical heater is a pair of optical heaters each disposed above said support arms when said support arms are in said retracted position.

3. The apparatus of claim 2 wherein each of said pair of optical heaters is configured to supply optical energy incident on each of said respective support arms when said pair of support arms is in said retracted position.

4. The apparatus of claim 2 wherein said pair of support arms is a first and second support arms, said apparatus further comprising a support frame extending over said first support arm to said second support arm when said support arms are in said retractable position, said support frame configured to house said pair of optical heaters.

5. The apparatus of claim 1 further comprising a pair of pads disposed on respective ones of said pair of support arms.

6. The apparatus of claim 5 wherein each of said pads further comprises a plurality of channels configured to receive coolant material therethrough when said pair of support arms is in said engaged position.

7. The apparatus of claim 6 wherein said optical heater is a pair of optical heaters disposed above a respective one of said pads, each of said optical heaters configured to supply optical energy incident on each of said pads.

8. The apparatus of claim 1 further comprising a support frame extending over said pair of support arms when said support arms are in said retractable position, said support frame configured to house said optical heater.

9. A regeneration method of cryogenic surfaces in an ion implanter comprising:
 retracting a pair of support arms away from a platen, said support arms having one or more pads disposed thereon;
 exposing at least one of said pair of support arms to optical energy for a given period of time such that condensed material disposed on one or more pads is removed; and
 exhausting said removed condensed material from said ion implanter.

10. The regeneration method of claim 9 wherein retracting said pair of support arms away from said platen further comprises vertically displacing said pair of support arms away from said platen.

11. The regeneration method of claim 9 wherein retracting said pair of support arms away from said platen further comprises rotatably displacing said pair of support arms away from said platen.

* * * * *